(12) United States Patent
Yashiki et al.

(10) Patent No.: US 6,480,928 B2
(45) Date of Patent: Nov. 12, 2002

(54) MEMORY REWRITING SYSTEM FOR VEHICLE CONTROLLER

(75) Inventors: Tetsuya Yashiki, Wako (JP); Masanori Matsuura, Wako (JP); Naohiko Mizuo, Wako (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 84 days.

(21) Appl. No.: 09/802,202

(22) Filed: Mar. 8, 2001

(65) Prior Publication Data

US 2001/0023374 A1 Sep. 20, 2001

(30) Foreign Application Priority Data

Mar. 16, 2000 (JP) .......................................... 2000-074237

(51) Int. Cl.$^7$ .............................................. G06F 12/00
(52) U.S. Cl. ........................ 711/103; 711/154; 711/155; 711/200; 711/202; 701/115
(58) Field of Search ....................... 365/185.33; 711/103, 711/154, 155, 200, 202; 701/115

(56) References Cited

U.S. PATENT DOCUMENTS

| | | | | |
|---|---|---|---|---|
| 5,872,994 A | * | 2/1999 | Akiyama et al. | ...... 365/185.33 |
| 6,101,163 A | * | 8/2000 | Kanno et al. | ............. 369/124.1 |
| 6,202,123 B1 | * | 3/2001 | Mukai et al. | ........... 365/185.33 |
| 6,269,429 B1 | * | 7/2001 | Nakamura | ................... 711/154 |
| 6,285,948 B1 | * | 9/2001 | Takagi et al. | ............... 307/10.5 |
| 6,405,279 B1 | * | 6/2002 | Kondo et al. | ............... 711/103 |

FOREIGN PATENT DOCUMENTS

| | | |
|---|---|---|
| JP | 63-223901 | 9/1988 |
| JP | 3-238541 | 10/1991 |

* cited by examiner

*Primary Examiner*—Than Nguyen
(74) *Attorney, Agent, or Firm*—Lahive & Cockfield, LLP

(57) ABSTRACT

A memory rewriting system for a vehicle controller is provided. The memory rewriting system transfers a first program from a rewriting device to the vehicle to rewrite a second program stored in a memory of the vehicle controller with the first program. The first program is transferred as data blocks. Each of the data blocks includes a program code field, a first address field and a second address field. The program code field contains a partial program code of the first program. The first address field contains a leading address of the memory in which the partial program code is stored. The second address field contains a leading address of the memory in which a following partial program code transferred by another block is to be stored. The data blocks are assembled in the rewriting device. Each data block is may be a fixed length or a variable length. When the data block is transferred to the vehicle controller, a first address in the first address field of the current transferred data block is compared with a second address in the second address field of the preceding transferred data block. If the first address included in the current data block is not equal to the second address included in the preceding data block, it is determined that the current transferred data block is not correct. The vehicle controller requests the rewriting device to retransfer a correct data block that has said second address in the first address field.

23 Claims, 9 Drawing Sheets

| the First Address | Program Code | the Second Address | |
|---|---|---|---|
| 3F20 | 30, 50, ··, FF | 3F50 | Data Block 1 |
| 3F50 | 68, 2F, ··, E5 | 3F70 | Data Block 2 |
| 3F70 | CA, 61, ··, 55 | 4000 | Data Block 3 |

| the First Address | Program Code | the Second Address | |
|---|---|---|---|
| 3F20 | 30, 50, ‥, FF | 3F50 | Data Block 1 |

| 3F50 | 68, 2F, ‥, E5 | 3F70 | Data Block 2 |
|---|---|---|---|

| 3F70 | CA, 61, ‥, 55 | 4000 | Data Block 3 |
|---|---|---|---|

| Address | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 3F2x | 30 | 50 | A1 | 24 | FF | FF | FF | FF | 5F | F3 | FF | 78 | 01 | FF | FF | FF |
| 3F3x | FF | FF | FF | FF | FF | FF | FF | FF | FF | FF | FF | FF | FF | FF | FF | FF |
| 3F4x | FF | FF | FF | FF | FF | FF | FF | FF | 3F | 54 | 26 | 9A | CB | 64 | CA | F0 |
| 3F5x | 01 | · | · | · | · | · | · | · | · | | | | | | | |

(b)

| 3F20 | 30, 50, A1, 24, FF, FF, FF, FF | 3F28 | 12 Bytes |
|---|---|---|---|
| 3F28 | 5F, F3, FF, 78, 01, FF, FF, FF | 3F48 | 12 Bytes |
| 3F48 | 3F, 54, 26, 9A, CB, 64, CA, F0 | 3F50 | 12 Bytes |

(c)

| 3F20 | 30, 50, A1, 24 | 3F28 | | 8 Bytes |
|---|---|---|---|---|
| 3F28 | 5F, F3 | 3F2B | | 6 Bytes |
| 3F2B | 78, 01 | 3F48 | | 6 Bytes |
| 3F48 | 3F, 54, 26, 9A, CB, 64, CA, F0 | 3F50 | | 12 Bytes |

(d)

| 3F20 | 30, 50, A1, 24 | 3F28 | | 8 Bytes |
|---|---|---|---|---|
| 3F28 | 5F, F3, FF, 78, 01 | 3F48 | | 9 Bytes |
| 3F48 | 3F, 54, 26, 9A, CB, 64, CA, F0 | 3F50 | | 12 Bytes |

FIG. 5

MEMORY REWRITING SYSTEM FOR VEHICLE CONTROLLER

FIELD OF THE INVENTION

The present invention relates to a memory rewriting system for rewriting data stored in a memory of a vehicle controller with another data transferred from an external rewriting device.

BACKGROUND OF THE INVENTION

Vehicles are subjected to various types of control by an electronic control unit (hereafter referred to as "ECU"). Such control includes engine-related control for an air fuel ratio, fuel injection amount, and emission as well as body-related control for a power window, an air bag, and an ABS. The ECU provides various types of control for the vehicle based on current conditions and traveling status of the vehicle sensed by various sensors mounted on the vehicle.

The ECU comprises a central processing unit (CPU), a ROM (Read Only Memory) that stores programs and data to be executed, a RAM (Random Access Memory) which provides a work area for execution and which stores results of computation, and an I/O interface for receiving signals from various sensors and transmitting control signals to various parts of the engine.

A system wherein the ROM comprises a rewritable memory, such as a flash memory, an EEPROM, or an EPROM, to allow a program or data therein to be rewritten through serial communication is known. Such a system comprises a rewriting device, a vehicle controller, and a serial communication path connecting them together. For example, Japanese Patent Application Laid-Open No. 63-223901 describes a method for changing a program stored in the EEPROM of the ECU in response to a request from an external device via a SCI (Serial Communication Interface) terminal with the ECU being mounted on the vehicle.

In such a system for rewriting a program through serial communication, the rewriting device assembles a plurality data blocks from program code of the program, and then serially transfers the data blocks to the vehicle controller. Each data block includes a partial program code. In order to inform the vehicle controller of a memory address at which a transferred partial program code is stored, one of the following method is typically employed:

1) the data blocks are serially transferred in an ascending order of address values of the program code.
2) a leading address of a partial program code is added to each data block. The data blocks are transferred in an arbitrary order.

There are, however, several problems with the above-mentioned methods. As to the method 1), program code must be transferred such that the entire memory area is rewritten with the transferred program code. This is because if the transfer is interrupted, it is hard to determine whether the interruption has take place due to the end of transfer of the program code or due to a failure in the communication path. This reduces the reliability of transfer. In the case all of the memory area is not used (it is very rare that all of the memory area is used), transfer of program code including free space results in a waste of time.

As to the method 2), the waste of time as occurring with the method 1) is resolved. Assume that the vehicle controller receives a partial program code specifying an address significantly separate from the preceding received address. For example, the vehicle controller receives 16 bytes starting with the address 1000 and then receives 10 bytes starting with the address 10100. It is hard to determine whether the portion between the two addresses is free space or the second address value has advanced by error. This reduces the reliability of transfer.

On the other hand, when the program code is transferred, particularly using serial communication, the transfer may be inaccurate due to disturbance such as electromagnetic waves.

Accordingly, both the ECU and the rewriting device require a mechanism for checking the transferred program code for consistency.

SUMMARY OF THE INVENTION

An object of the present invention is to provide a memory rewriting system that makes program transfer more reliable and more efficient without wasting time in program transfer.

Another object of the present invention is to provide a memory rewriting system that allows both a rewriting device and an ECU to check the consistency of a transferred program code.

According to one aspect of the invention, a rewriting device for transferring a first program to a vehicle controller to rewrite a second program stored in a memory of the vehicle controller with the first program is provided. The first program is transferred as data blocks. Each of the data blocks includes a program code field for a partial program code of the first program, a first address field for a leading address of the memory in which the partial program code is stored, and a second address field for a leading address of the memory in which the following partial program code to be transferred by another data block is to be stored. The vehicle controller can determine that a correct data block has been received by checking whether the received data block contains in the first address field the address that was included in the second address field of the preceding data block.

In one embodiment of the invention, the rewriting device further comprises a controller for assembling the data blocks. The controller can assemble the data blocks with a fixed length or a variable length. In the latter case, the data block can be assembled so as not to include free space. In another embodiment, the data block is assembled such that the length of the data block is determined based on the size of free space between partial program codes.

In one embodiment of the invention, the vehicle controller is further configured to compare a first address in the first address field of a current data block with a second address in the second address field of a preceding data block. The vehicle controller determines that the current data block is correct if the first address included in the current data block is equal to the second address included in the preceding data block.

In another embodiment of the invention, the vehicle controller is further configured to transfer the second address included in the preceding data block to the rewriting device if it is determined that the current data block is not correct. Thus, the vehicle requests the rewriting device to retransfer a correct data block. The program code is stored in the memory of the vehicle controller in a correct order, thereby enhancing the efficiency of program transfer.

In one embodiment of the invention, in response to the retransfer request from the vehicle controller, the rewriting device retransfers the correct data block if the second address transferred from the vehicle controller is within a predetermined range. The predetermined range may include an address value in the first address field of the data block transferred immediately before the retransfer request, an address value in the first address field of the data block preceding such data block, and an address value in the first address field of the data block that was to be transferred following such data block.

In another embodiment of the invention, in response to the retransfer request from the vehicle controller, the rewriting device retransfers data blocks of the first program from the beginning if a difference between the second address transferred from the vehicle controller and an address value in the first address field of the data block transferred immediately before the retransfer request is greater than a predetermined value.

BRIEF DESCRIPTION OF THE DRAWINGS

FIG. 4 is a view showing a format of a data block for program transfer executed by the memory rewriting system according to one embodiment of the present invention;

FIG. 5($a$) is a view showing transferred program code and corresponding addresses, FIG. 5($b$) is a view showing an example where a data block is assembled to have a fixed length, FIG. 5($c$) is a view showing an example where a data block is assembled to have a variable length, and FIG. 5($d$) is a view showing an example where a data block is assembled to have a variable length in view of the free space, according to one embodiment of the present invention;

DETAILED DESCRIPTION OF THE PREFERRED EMBODIMENTS

Preferred embodiments of the present invention will be described referring to attached drawings. According to one embodiment of the invention, a memory rewriting system for rewriting a security program stored in a non-volatile memory of a vehicle controller is provided. This security program serves as a "key" for releasing security feature of the vehicle, the security feature preventing data stored in the memory of the ECU from being illegally rewritten. A rewriting device authorized by a relevant automobile manufacturer can rewrite the data stored in the memory of the ECU of that automobile, using this "key".

If, however, this key is divulged to a third party, the data in the ECU can be rewritten without the authorized rewriting device, thereby breaking the security feature. In order to recover the security feature, according to a system described below, the security program, or "key", can be rewritten with a new security program.

The present invention, however, is not limited to the system for rewriting a security program but is applicable to various systems for rewriting data stored in a non-volatile memory.

Figure 1:
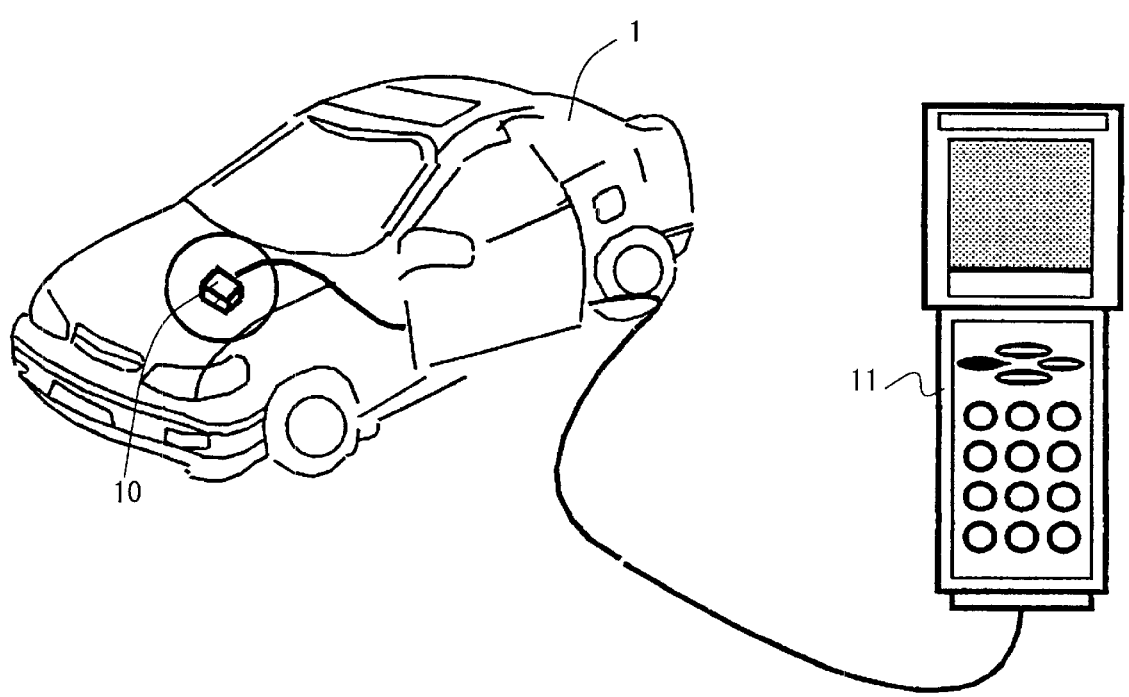
FIG. 1 is a view showing an outline of a memory rewriting system according to the present invention.

FIG. 1 shows an outline of a memory rewriting system according to one embodiment of the present invention. The memory rewriting system comprises an electronic control unit (ECU) 10 mounted on a vehicle 1 and a rewriting device 11. The rewriting device 11 is authorized by the manufacturer of the vehicle 1. The ECU 10 comprises a rewritable ROM (not shown). As shown in the figure, when the rewriting device 11 is connected to the ECU 10 and some appropriate operation to the rewriting device 11 is performed, a security feature for preventing a program or data stored in the ROM of the ECU 10 from being rewritten without proper authorization is released. Thus, the rewriting device is allowed to rewrite the program or data stored in the ROM.

Rewriting is executed via serial communication between the ECU 10 and the rewriting device 11. A user can send data for rewriting to the ECU 10 by operating buttons on the rewriting device 11 and/or interacting with a display screen provided on the rewriting device 11. The rewriting device, however, is not limited to the form shown in the figure, but may be of another form having a protocol that enables communication with the ECU 10.

Figure 2:
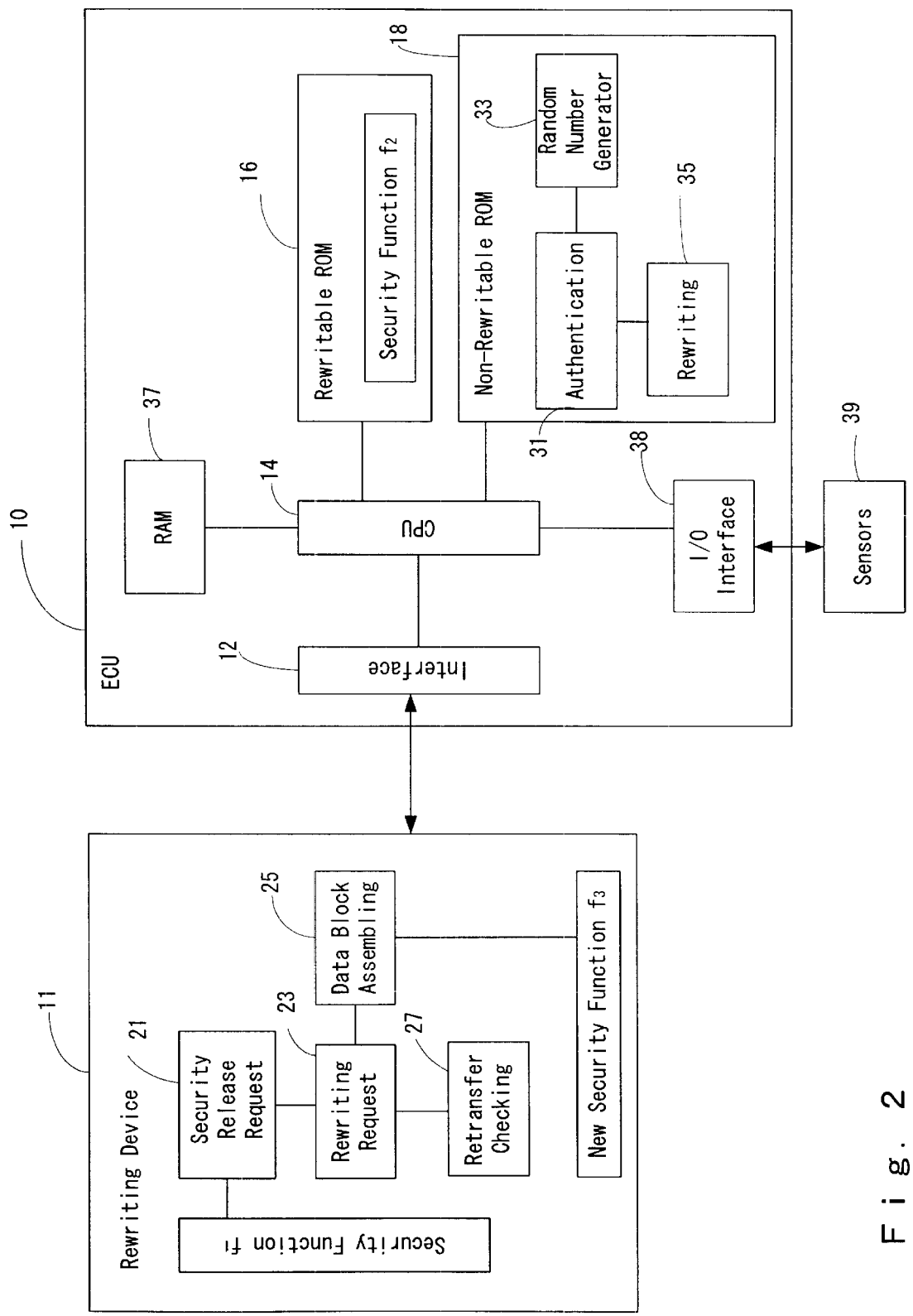
FIG. 2 is a block diagram showing the entire memory rewriting system according to one embodiment of the present invention.

FIG. 2 is a functional block diagram showing the entire memory rewriting system according to one embodiment of the present invention. As described above, the memory rewriting system comprises the ECU 10 mounted on the vehicle and the rewriting device 11. The rewriting device 11 is provided outside the ECU 10 and connected thereto via serial communication.

The ECU 10 comprises a central processing unit 14 (hereafter referred to as a "CPU") including a microcomputer and associated circuit elements, ROMs 16 and 18 which are non-volatile memories and which store programs and data, a RAM 37 (Random Access Memory) which provides a work area for execution and which stores results of computations, and an I/O interface 38 for receiving signals from various sensors 39 and transmitting control signals to various parts of the engine. Signals from various sensors 39 include an engine rotation speed (Ne), an engine water temperature (Tw), an intake air temperature (Ta), a battery voltage (VB), and an ignition switch (IGSW). Thus, based on a signal input from the I/O interface 38, the CPU 14 invokes a control program and data from the ROMs 16 and 18 to execute computations, and outputs the results to various parts of the vehicle via the I/O interface 38 to control various functions of the vehicle.

The ECU 10 also comprises an interface 12. The interface 12 has a protocol for communication with the rewriting device 11 to enable serial communication between the ECU 10 and the rewriting device 11.

The rewritable ROM 16 is a memory from and to which stored data can be deleted and new data can be written The rewritable ROM 16 can be, for example, a flash memory or an EEPROM. The non-rewritable ROM 18 can be implemented by specifying a part of the memory area of the rewritable ROM as an unchangeable area, or by using a mask ROM for which data are fixed during manufacturing and from or to which data can subsequently not be deleted or written. Alternatively, the ROM 18 can be implemented with a PROM to which data can be written only once.

The ROMs 16 and 18 can be implemented as two memories that are physically separated. Alternatively, the memory area of a single memory may be divided into two areas so that one of the areas is used as a rewritable area, while the other is used as a non-rewritable area. In the latter case, for example, after a non-rewritable area in which a program or the like is stored has been specified in the EEPROM, a rewritable area is specified with a start address and an end address in the unfilled space of the memory.

Figure 3:
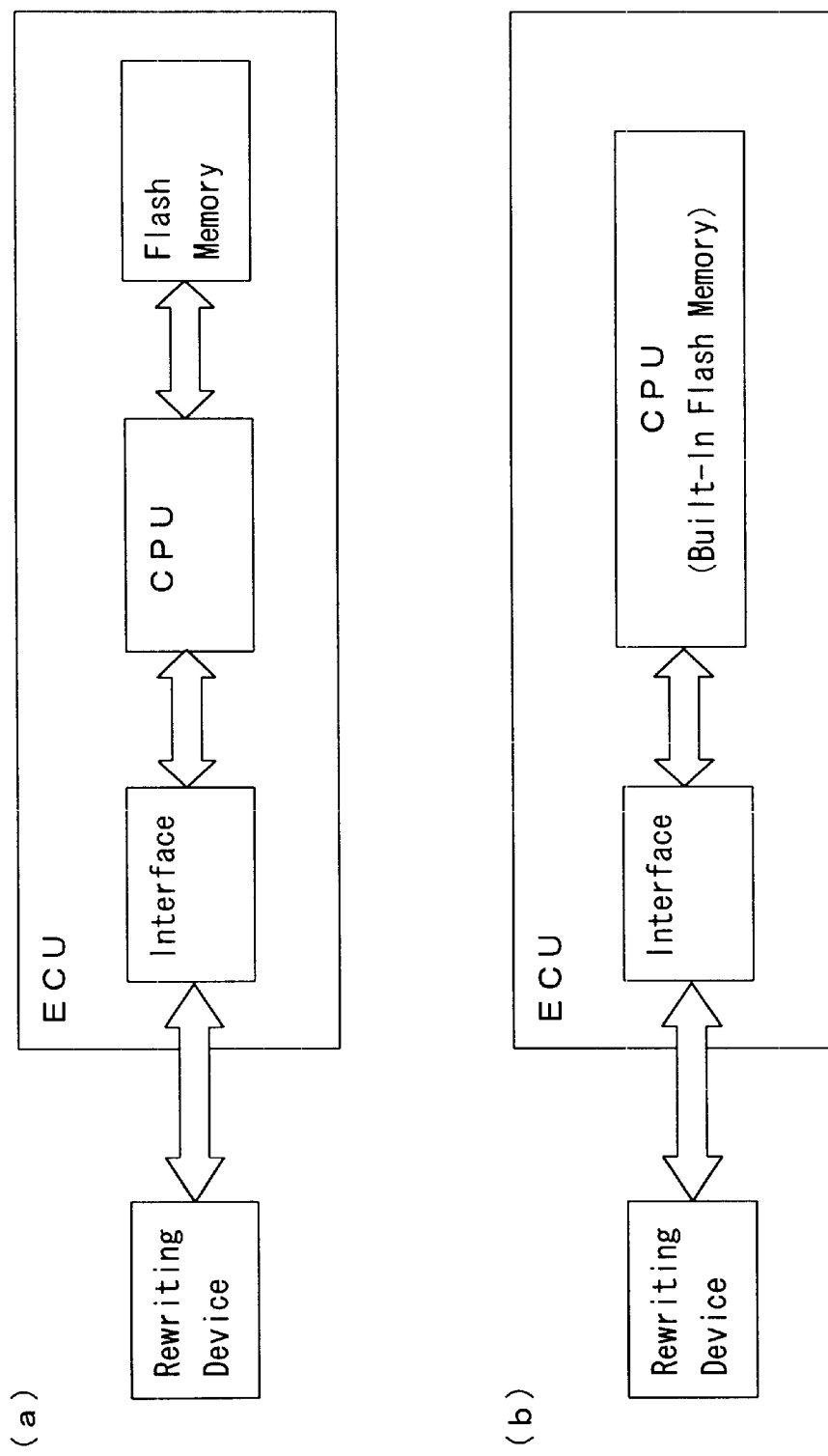
FIG. 3 is a view showing examples of a form of a ROM and a CPU of the ECU in the memory rewriting system according to one embodiment of the present invention.

Now, examples of a form of the ROMs 16 and 18 and CPU will be described with reference to FIG. 3. In this figure, the ROMs 16 and 18 are implemented using a flash memory. FIG. 3(a) shows a form in which the flash memory is provided separately from the CPU. When a rewriting operation mode is entered through communication with the rewriting device 11, the CPU receives data from the rewriting device 11, and invokes a program for rewriting the flash memory with the received data.

On the other hand, FIG. 3(b) shows a form having a built-in flash memory that constitutes one chip in conjunction with the CPU. When the rewriting operation mode is entered in response to a signal from the rewriting device, data transferred from the rewriting device is automatically written to the flash memory using a function incorporated in the CPU. The memory rewriting system according to the present invention is applicable to either of the above forms.

Referring back to FIG. 2, the rewritable ROM 16 stores a security function $f_2$. The security function $f_2$ realizes a security feature for preventing the data stored in the ROM 16 from being illegally rewritten.

The non-rewritable ROM 18 stores programs for implementing an authentication part 31, a random number generator 33, and a rewriting part 35. The authentication part 31 is responsive to a request for releasing security from the rewriting device 11, and determines whether the rewriting device 11 is authentic using the security function $f_2$ and a random number R. The random number R is generated by the random number generator 33. Using the random number R enables the security feature to be enhanced. If it is determined that the rewriting device is authentic, the authentication part 31 releases the security feature.

After the security feature has been released by the authentication part 31, the rewriting part 35 deletes the security function $f_2$ The security function $f_2$ may be physically or logically deleted. The logically deletion may be implemented using a deletion flag. More specifically, the security function $f_2$ with the deletion flag being set is considered to be deleted in subsequent processes.

The rewriting part 35 serially receives data blocks representative of a new security function $f_3$ from the rewriting device 11. The data blocks are assembled from program code of the new security function $f_3$, as described in detail below. The rewriting part 35 determines whether the received data block is correct. If it is determined the received data block is correct, the rewriting part 35 writes a partial program code included in the data block into the ROM 16. On the contrary, if it is determined the received data block is not correct, the rewriting part 35 requests the rewriting device 11 to retransfer a correct data block.

The rewriting device 11 has a security function $f_1$ and the new security function $f_3$. The security function $f_1$ implements the security feature in cooperation with the security function $f_2$ stored in the ROM 16 of the ECU 10. The security functions $f_2$ and $f_3$ correspond to the above-mentioned "key". If the security function $f_2$ has not been changed by a third party, the security function $f_1$ of the rewriting device 11 is the same as the security function $f_2$ of the ECU 10. In another embodiment, the security functions $f_1$ and $f_2$ have a certain relationship. If the relationship is kept, it is determined that the security functions $f_2$ has not been tampered.

The new security function $f_3$ is prepared prior to rewriting the security function $f_2$ stored in the ROM 16. The new security function $f_3$ can be created by making certain changes to the current security functions fi. According to one example, the new security function $f_3$ is a function that has a different expression from the security functions $f_1$. According to another example, the new security function $f_3$ is a function that has different constant(s) in the function expression from the security functions $f_1$. For example, when the functions $f_1$ and $f_2$ are $f_1 = f_2 = A \times R + B$ (A=10 and B=5), the new security function $f_3$ is set such that $f_3 = A + R \times B$ (A=10 and B=5). Alternatively, the values of the constants A and B of the functions $f_1$ and $f_2$ may be changed to 5 and 10, respectively.

The rewriting device 11 also comprises a security release request part 21, a rewriting request part 23, and a data block assembling part 25, which may be stored in a memory of the rewriting device 11 as programs. The security release request part 21 uses the security functions $f_1$ to request the ECU 10 to release the security feature.

The data block assembling part 25 assembles data blocks from program code of the new security function $f_3$ to be transmitted to the ECU 10. The data blocks are suitable for serial communication. As described below in detail with reference to FIGS. 4 and 5, each of the data blocks includes a program code field, a first address field and a second address field. The program code field includes a partial program code of program code of the new security function $f_3$. The first address field includes a leading address of the ROM 16 at which the partial program code is stored. The second address field includes a leading address of the ROM 16 at which the following partial program code to be transferred by another data block is to be stored. After the security feature has been released, the rewriting request part 23 transfers the data blocks representative of the new security function $f_3$ assembled by the data block assembling part 25, to the ECU 10.

The retransfer checking part 27 checks the consistency of the retransfer request from the ECU 10. If it is determined that the retransfer request is consistent, the retransfer checking part 27 instructs the rewriting request part 23 to retransfer the data block requested by the ECU 10. If it is determined that the retransfer request is inconsistent, the retransfer checking part 27 instructs the rewriting request part 23 to retransfer all the data blocks representative of the security function $f_3$ from the beginning. Alternatively, instead of retransferring all the data blocks from the beginning, the retransfer may start with any data block that was judged to be correct by the ECU 10. For example, the retransfer may start with the fifth data block upstream of the one that caused the retransfer request.

The retransfer request is determined to be inconsistent if the address sent with the retransfer request from the ECU 10 is apart from the address value in the first address field of the data block transferred immediately before the retransfer request, by a predetermined value or more.

A form of a data block assembled by the data block assembling part 25 will be described in detail with reference to FIG. 4. As shown in FIG. 4, each data block includes a program code field, a first address field and a second address field. The first address field is provided before the program code field, and the second address field is provided after the program code field. The above arrangement of the first and second address fields is one example, any other arrangement may be used.

The program code field contains a partial program code of program code of the new security function $f_3$. The first address field contains a leading address of the rewritable ROM 16 in which the partial program code is stored. The second address field contains a leading address of the rewritable ROM 16 in which the following partial program code to be transferred by another data block is to be stored.

The data block assembling part 25 divides program code of the new security function $f_3$ into a plurality of pieces. Each piece of the program code, or each partial program code, is placed in the program code field of a data block. A leading address of the partial program code is placed in the first address field of the data block. A leading address of the following partial program code is placed in the second address field of the data block. Thus, the data block is assembled.

For example, assume that a data block 2 is to be transferred after a data block 1. The data block 1 is assembled as follows. A partial program code "30, 50, . . . FF" is placed in the program code field. A leading address of the partial program code "3F20" is placed in the first address field. A leading address of the following partial program code "3F50" is placed in the second address field. As shown in FIG. 4, the address in the second address field of the data block 1 has the same address as the address in the first address field of the data block 2. Since the second address field of a data block has a leading address of the following partial program code, the ECU can determine whether program code is received in a correct order.

When a data block has been transferred from the rewriting device 11, the rewriting part 35 of the ECU 10 compares an address value in the second address field of the preceding transferred data block with an address value in the first address field of the current transferred data block. If these address values are equal, the rewriting part 35 writes a partial program code included in the current data block in an address of the rewritable ROM 16 which is indicated by the address value in the first address field of the current data block.

Even if the communication is interrupted during transfer, the ECU 10 can determine where the last partial program code was stored in the memory and which partial program code is to be transferred. Thus, the ECU 10 can notify the rewriting device 11 of a data block to be retransferred, thereby making the program transfer more reliable.

For example, assume that a failure has occurred in communication between transfer of the data block 1 and transfer of the data block 2 shown in FIG. 4. The second address 3F50 of the data block 1, which has already been stored in the rewritable Rom 16, shows that the data block 1 has been correctly transferred and that the data block 2 starting with the address 3F50 is to be transferred. Accordingly, the ECU 10 can request the rewriting device 11 to retransfer the data block 2 that has the address 3F50 in the first address field. Thus, the communication is resumed from transfer of the data block 2.

Assume that the data block 3 starting with the address 3F70 is transferred after the data block 1. The second address 3F50 of the data block 1 shows that the ECU 10 has not received the data block 2 starting with the address 3F50, which is located between the addresses 3F20 and 3F70. The ECU 10 requests the rewriting device 11 to retransfer the data block 2. Thus, even if transfer of the data block 2 has failed due to a failure in communication, program transfer can be recovered by requesting the rewriting device 11 to retransfer the data block 2 that has the address 3F50 in the first address field. This saves time, and increases the efficiency of program transfer.

The last data block may not have the second address field or may contain a special control code indicative of the end of the program code.

Transfer and writing of the program code requires a relatively large amount of time. Thus, the transfer efficiency is preferably improved by avoiding transfer of free space. The memory rewriting system according to the present invention can vary the length of a partial program code to be transferred. In other words, data blocks can be assembled so as not to contain free space.

FIG. 5(a) shows an example of program code to be transferred from the rewriting device 11 to the ECU 10, in conjunction with addresses. FIG. 5(b) shows an example of data blocks with a fixed length. FIGS. 5(c) and (d) show examples of data blocks with a variable length. In FIG. 5(a), "FF" denotes a free space. Addresses containing substantial program code are 3F20 to 3F23, 3F28 to 3F29, 3F2B to 3F2C, 3F48 to 3F4F, and 3F50.

FIG. 5(b) shows one example of data blocks assembled from the program code of FIG. 5(a). The data block assembling part 25 divides the program code into a plurality of pieces such that each piece has a length of eight bytes. In the example, the first and second address fields have a length of two bytes, respectively. Thus, a 12-byte data block is assembled. When the entire program code field is filled with "FF" bytes, no data block is assembled. This is because a data block containing only free space does not need to be transferred. Consequently, three data blocks each composed of 12 bytes are assembled, 36 bytes of data are transferred in total.

FIG. 5(c) shows an another example of data blocks assembled from the program code of FIG. 5(a). The data assembling part 25 scans the program code from the beginning. The data assembling part 25 divides the program code into a plurality of pieces such that each piece has a length of eight bytes. The data assembling part 25 removes "FF" byte if it is found in each piece. Thus, a data block is assembled such that the program code field does not contain "FF" byte. As a result, data blocks have a variable length. As shown in FIG. 5(c), four data blocks are assembled and 32 bytes of data are transferred in total. This method transfers no "FF" byte, thereby making the transfer more efficient compared to FIG. 5(b).

To further improve the transfer efficiency, the data block assembling part 25 of the present invention can assemble data blocks based on the size of free space. In other words, if the size of free space between areas containing program code is larger than a predetermined value, data blocks are assembled so as not to transfer the free space. On the other hand, if the size of free space between areas containing program code is equal to or smaller than the predetermined value, data blocks are assembled so as to include the free space.

As shown FIG. 5(c), only one "FF" byte is present between the partial program code starting with the address 3F28 and the partial program code starting with the address 3F2B. The "FF" byte is located at address 3F2A. In view of the length of the address fields, transfer of these two partial program codes is more efficient when they are transferred as one data block containing the "FF" byte at address 3F2A as shown in FIG. 5(d) than when they are transferred as two data blocks as shown in FIG. 5(c). Consequently, if it is found that, for example, less than four "FF" bytes are contiguous, one data block containing "FF" byte(s) is assembled as shown in FIG. 5(d). Thus, 29 bytes of data are transferred in total. The efficient of transfer is increased.

The memory rewriting system according to the present invention includes any of the data block forms shown in FIGS. 5(b) to (d).

The operation of the memory rewriting system shown in FIG. 2 is described with reference to FIGS. 6 and 7. Rewriting operation is initiated, for example, when an operation button of the rewriting device 11 is pressed after the rewriting device 11 has been connected to the ECU 10. Alternatively, the rewriting operation may be initiated by operating the ECU 10.

At step 41, the security release request part 21 of the rewriting device 11 transfers a signal indicative of a request for releasing security to the ECU 10. The ECU 10 responds to this signal to start an authentication process for confirming that the authorized rewriting device is connected thereto. The authentication process will be described below referring to FIG. 7.

If the ECU authenticates the rewriting device 11 and permits it to rewrite to the rewritable ROM 16, the process proceeds to step 42. The rewriting request part 23 of the rewriting device 11 transfers a signal indicative of a start of rewriting to the ECU 10, and the rewriting part 35 of the ECU 10 returns a start permission signal when ready for rewriting. At step 43, the rewriting device 11 transfers a request for shifting to a rewriting operation mode to the ECU 10, and then the rewriting part 35 of the ECU 10 executes a process for shifting to the rewriting operation mode. At step 44, the rewriting request part 23 queries the ECU 10 if the shift of the operation mode has completed. The rewriting part 35 transfers a signal indicative of a completion of the shift to the rewriting device 11 if the shift has been completed.

At step 45, the rewriting request part 23 requests the security function $f_2$ stored in the rewritable ROM 16 to be deleted, and in response to this, the rewriting part 35 deletes the security function $f_2$ from the ROM 16.

At this point, in the rewriting device 11, the new security function $f_3$ has been prepared. The function $f_3$ has been provided by the data block assembling part 25 as data blocks for transmission to the ECU 10. The security function $f_3$ is typically created before the rewriting device 11 transfers the request for releasing security or the notification for starting of rewriting to the ECU 10. This preparation for the new security function $f_3$, however, may be carried out immediately before the step 45.

The new security function $f_3$ may be prepared, for example, selecting one from a number of functions previously saved in the rewriting device 11. Alternatively, a user may create the new security function $f_3$ by manipulating the rewriting device 11.

At step 46, the rewriting request part 23 transfers the first one of the data blocks representative of the new security function $f_3$ to the ECU 10 together with a signal indicative of a request for writing to the rewritable ROM 16. The rewriting part 35 receives the data block from the rewriting device 11 and compares a first address value in the first address field of the current transferred data block with a second address value in the second address field of the preceding transferred data block. If the first address value included in the current data block is equal to the second address value included in the preceding data block, a partial program code contained in the current data block is written to the rewritable ROM 16.

Once writing of the partial program code has been completed, the rewriting part 35 transfers a notification of the completion of writing to the rewriting device 11. In response to this, the rewriting device 11 transfers the following data block to the ECU 10. This step 46 is repeated until all the program code of the security function $f_3$ is written into the ROM 16.

Although not shown in figure, if the first address value of the current data block is not equal to the second address value of the preceding data block at step 46, the rewriting part 35 of the ECU 10 transfers a signal indicative of the retransfer request to the rewriting device 11. The retransfer request signal is a signal that requests the rewriting device 11 to retransfer a correct data block. The retransfer checking part 27 of the rewriting device 11 checks whether the retransfer request is consistent. If it is determined that the retransfer request is consistent, the rewriting request part 23 retransfers the correct data block to the ECU 10. If it is determined that the retransfer request is inconsistent, the rewriting request part 23 retransfers data blocks of the new security function $f_3$ from the beginning.

Once writing of all the program code has completed, the rewriting request part 23 transfers a request for releasing the rewriting operation mode to the ECU 10 (step 47). In response to this, the rewriting part 35 of the ECU 10 releases the rewriting operation mode. Since the rewriting device 11 has changed the security function stored in the ROM 16 to $f_3$, the function used by the rewriting device 11 is also set to $f_3$ so that the security feature can subsequently be implemented by means of the security function $f_3$. After the new security function $f_3$ has been written to the ROM 16, the preceding security function fi may be deleted.

Figure 6:
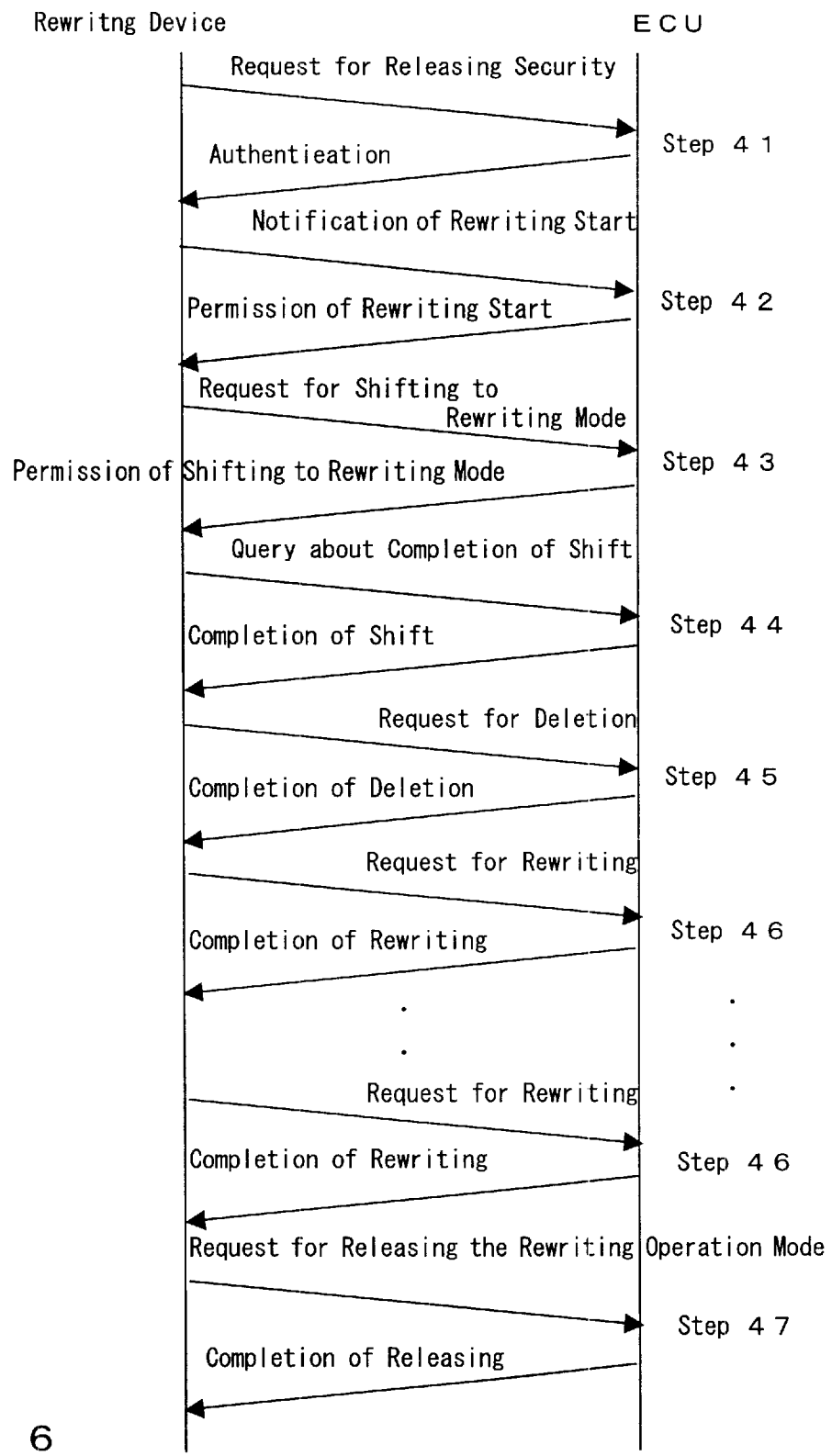
FIG. 6 is a view showing an operational procedure of the memory rewriting system according to one embodiment of the present invention.
Figure 7:
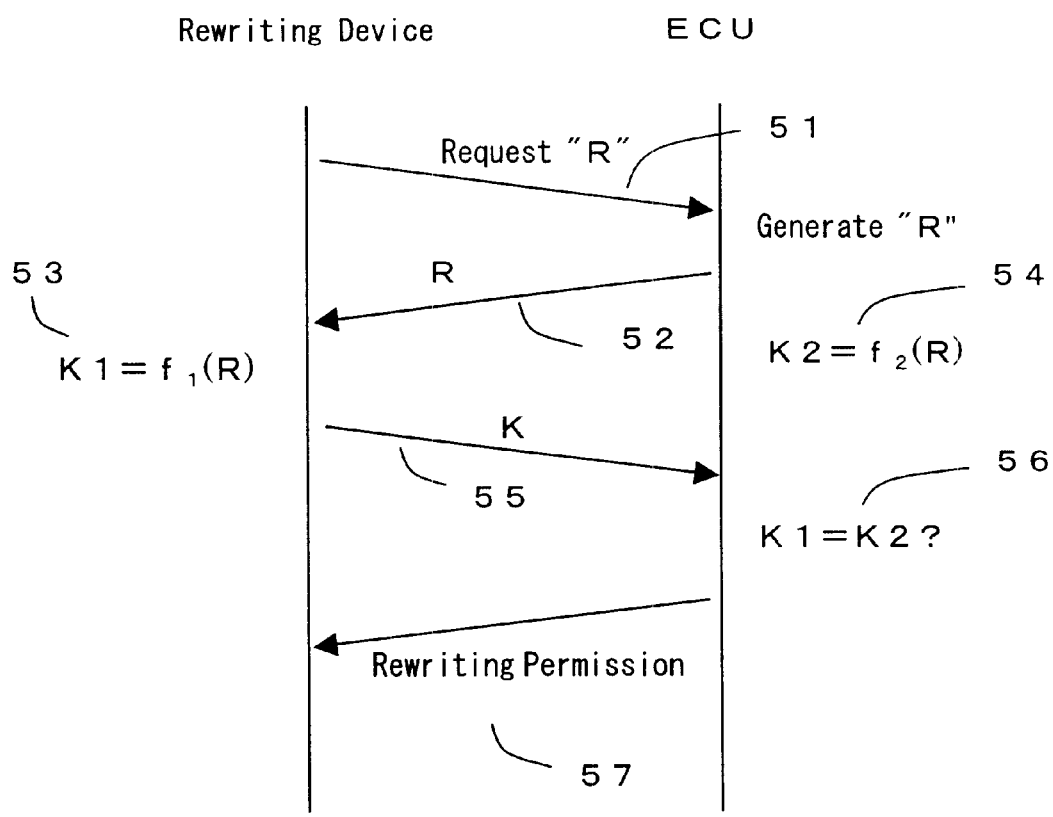
FIG. 7 is an authentication procedure executed by the memory rewriting system according to one embodiment of the present invention.

FIG. 7 shows an example of the authentication process corresponding to step 41 in FIG. 6. At step 51, the security release request part 21 of the rewriting device 11 requests the ECU 10 to transfer an arbitrary number R. In response to this, the authentication part 31 of the ECU 10 is invoked. The authentication part 31 invokes the random number generator 33 that generates random numbers. The authentication part 31 arbitrarily selects the number R from the random numbers generated by the random number generator 33, and transfers the number R to the rewriting device 11 (step 52). Alternatively, a different mechanism may be used to set an arbitrary number R. The rewriting device 11 uses the security function $f_1$ already stored therein to determine the function value K1 of the function $f_1$ for the number R based on K1=$f_1$(R) (step 53).

On the other hand, the authentication part 31 of the ECU 10 uses the security function $f_2$ stored in the rewritable ROM 16 to determine a function value K2 based on K2=$f_2$(R) (step 54). The security release request part 21 of the rewriting device 11 transfers the function value K1 to the ECU 10 (step 55). The authentication part 31 then compares the function value K1 from the rewriting device 11 with the internally determined function value K2 (step 56), and if they are equal, determines that the rewriting device 11 is authentic. The authentication part 31 transfers a signal indicative of a permission of rewriting to the rewriting device 11 (step 57).

Figure 8:
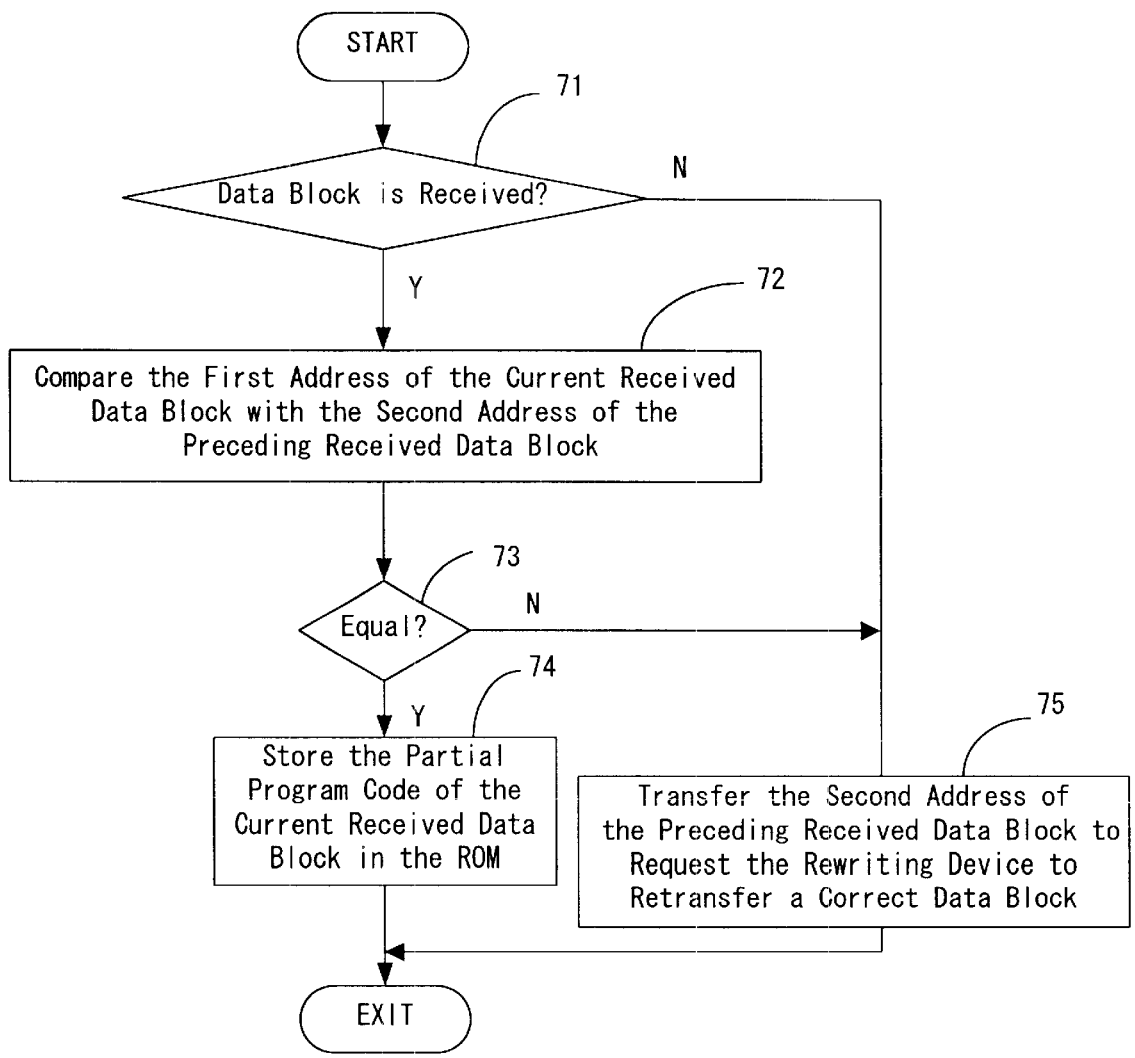
FIG. 8 is a flow chart showing an operation of the EUC in transferring a program according to one embodiment of the present invention.

FIG. 8 is a flow chart showing an operation for program transfer executed by the ECU 10. This flow is entered when the rewriting device 11 issues a signal indicative of a request for rewriting to the ECU 10 in FIG. 6. At step 71, the ECU 10 determines whether it has received a data block from the rewriting device 11, and if so, the process proceeds to step 72. Whenever the ECU 10 receives one data block, it compares a first address in the first address field of the current received data block with a second address in the second address field of the preceding received data block.

Since the first received data block does not have the preceding data block for comparison, the process proceeds to step 74. The ECU 10 may check whether the data block contains a code indicative of the first data block. If the ECU 10 determines that the code is included in the received data block, it writes a partial program code included in the data block to the rewritable ROM 16 without comparison.

If the first address included in the current data block is equal to the second address included in the preceding data block at step 73, the ECU 10 determines that the current received data block is correct. The ECU 10 stores a partial program code included in the current data block in an address of the rewritable ROM which is indicated by the first address included in the current data block (step 74). If the first address included in the current data block is not equal to the second address included in the preceding data block at step 73, the ECU 10 determines that the current data block is not correct. Accordingly, the ECU 10 notifies the rewriting device 11 of the second address of the preceding data block and requests it to retransfer a correct data block that has such second address in the first address field (step 75). As described above, the second address of the preceding data block indicates a leading address of a partial program code that is to be transferred following the preceding data block. When the ECU 10 requests for retransfer, it may provide a certain display that is indicative of an error. Thus, the ECU can receive data blocks in an correct order.

Figure 9:
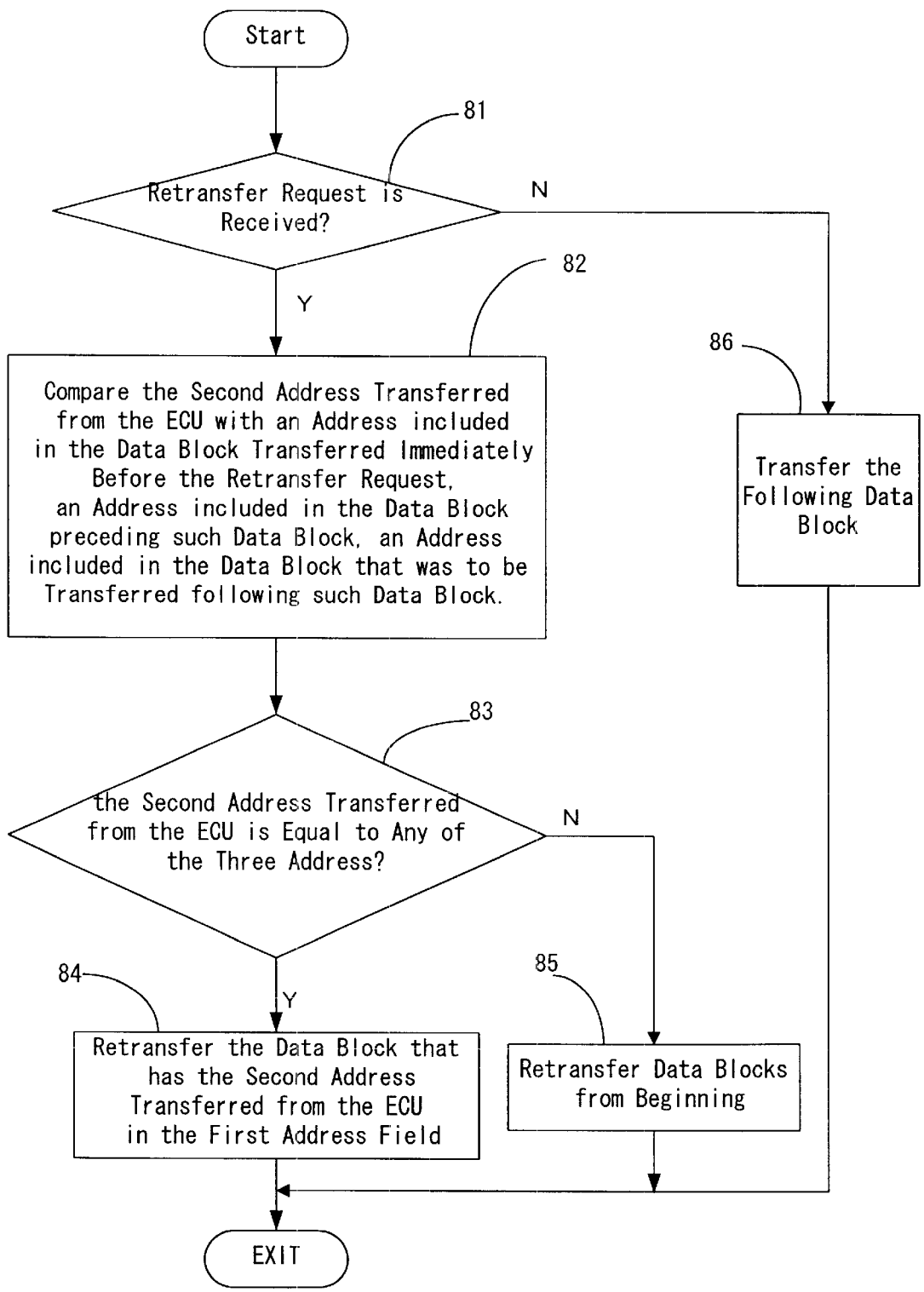
FIG. 9 is a flow chart showing an operation of the rewriting device in transferring a program according to one embodiment of the present invention.

FIG. 9 is a flow chart showing an operation for program transfer executed by the rewriting device 11. The rewriting device 11 continues to serially transfer data blocks unless it receives the retransfer request from the ECU 10 (steps 81 and 86). At step 81, if the rewriting device 11 receives the retransfer request from the ECU 10, it checks the consistency of the retransfer request (step 82). More specifically, the rewriting device 11 compares the second address transferred along with the retransfer request from the ECU 10 (see step 75 in FIG. 8), with three addresses. The three addresses are:

1) an address value in the first address field of the data block transferred immediately before the retransfer request,
2) an address value in the first address field of the data block preceding such data block, and
3) an address value in the first address field of the data block that was to be transferred following such data block.

If the second address is equal to any of the three addresses (step 83), it is determined that the retransfer request is consistent. The rewriting device 11 retransfers the data block that has such second address in the first address field (step 84). If the second address is equal to none of the three addresses at step 83, then it is determined that the retransfer request is inconsistent. If the second address is equal to none of the these three addresses, there is a high possibility that an leading address of the partial program code requested for retransfer is incorrect. The rewriting device 11 retransfers data blocks representative of the entire security function $f_3$ from the beginning (step 85). In this case, the rewriting device 11 actually requests the ECU 10 to delete the already transferred and written program code.

Alternatively, said second address transferred from the ECU 10 may be compared with more or less addresses. For example, it may be determined that the retransfer request is consistent if a difference between said second address and an address in the first address field of the data block transferred immediately before the retransfer request is less than a predetermined value.

If some error occurs in retransfer, the rewriting device 11 can attempt to retransfer a number of times. Moreover, the rewriting device 11 can stop the attempt if an error occurs even after retransfer has been attempted a predetermined number of times. In such a case, the ECU 10 can request the rewriting device 11 to retransfer data blocks of the security function $f_3$ from the beginning.

Thus, the rewriting device checks whether the retransfer request from the ECU is consistent, preventing data blocks from being transferred in inaccurate order.

What is claimed is:

1. A rewriting device for transferring a first program to a vehicle controller to rewrite a second program stored in a memory of the vehicle controller with the first program;
   wherein the first program is transferred as data blocks, each of the data blocks comprising a program code field for a partial program code of the first program, a first address field for a leading address of the memory in which the partial program code is stored, and a second address field for a leading address of the memory in which a following partial program code to be transferred by another data block is to be stored.

2. The rewriting device of claim 1, further comprising a controller for assembling the data blocks from the first program.

3. The rewriting device of claim 2, wherein the controller is configured to assemble the data block having a fixed length.

4. The rewriting device of claim 2, wherein the controller is configured to assemble the data block having a variable length.

5. The rewriting device of claim 4, wherein the controller is configured to assemble the data block so as not to include free space.

6. The rewriting device of claim 4, wherein the controller is configured to assemble the data block such that the length of the data block is determined based on the size of free space between partial program codes.

7. A vehicle controller for receiving a first program from a rewriting device to rewrite a second program stored in a memory mounted therein with the first program; and
   wherein the first program is transferred as data blocks, each of the data blocks comprising a program code field for a partial program code of the first program, a first address field for a leading address of the memory in which the partial program code is stored, and a second address field for a leading address of the memory in which a following partial program code to be transferred by another data block is to be stored.

8. The vehicle controller of claim 7, is further configured to compare a first address in the first address field of a current transferred data block with a second address in the second address field of a preceding transferred data block, and to determine the current transferred data block is correct if the first address included in the current transferred data block is equal to the second address included in the preceding transferred data block.

9. The vehicle controller of claim 8, is further configured to transfer the second address included in the preceding transferred data block to the rewriting device if it is determined that the current transferred data block is not correct, for requesting the rewriting device to retransfer a correct data block that has said second address in the first address field.

10. A memory rewriting system for a vehicle controller for transferring a first program from a rewriting device to a vehicle to rewrite a second program stored in a memory of the vehicle controller with the first program; and wherein the first program is transferred as data blocks, each of the data blocks comprising a program code field for a partial program code of the first program, a first address field for a leading address of the memory in which the partial program code is stored, and a second address field for a leading address of the memory in which a following partial program code to be transferred by another data block is to be stored.

11. The memory rewriting system of claim 10, wherein the vehicle controller is configured to compare a first address in the first address field of a current transferred data block with a second address in the second address field of a preceding transferred data block, and to determine the current transferred data block is correct if the first address included in the current transferred data block is equal to the second address included in the preceding transferred data block.

12. The memory rewriting system of claim 11, wherein the vehicle controller is configured to transfer the second address included in the preceding transferred data block to the rewriting device if it is determined that the current transferred data block is not correct, for requesting the rewriting device to retransfer a correct data block that has said second address in the first address field.

13. The memory rewriting system of claim 12, wherein the rewriting device is configured to retransfer the correct data block requested from the vehicle controller if the second address transferred from the vehicle controller is within a predetermined range.

14. The memory rewriting system of claim 13, the predetermined range includes an address value in the first address field of a data block transferred immediately before the retransfer request, an address value in the first address field of the data block preceding such data block, and an address value in the first address field of the data block that was to be transferred following such data block.

15. The memory rewriting system of claim 12, wherein the rewriting device is configured to retransfer data blocks of the first program from the beginning if a difference between the second address transferred from the vehicle controller and an address value in the first address field of the data block transferred immediately before the retransfer request is greater than a predetermined value.

16. The memory rewriting system of claim 12, wherein the rewriting device is configured to attempt the retransfer a predetermined times until the retransfer is performed successfully.

17. The memory rewriting system of claim 10, wherein the transfer of the data blocks is carried out via serial communication.

18. A method for transferring a first program from a rewriting device to a vehicle controller to rewrite a second program stored in a memory of the vehicle controller with the first program, the method comprising:

at the rewriting device, assembling data blocks from program code of the first program, each of the data blocks including a program code field for a partial program code of the first program, a first address field for a leading address of the memory in which the partial program code is stored, and a second address field for a leading address of the memory in which a following partial program code transferred by another data block is t o be stored; and transferring the data blocks from the rewriting device to the vehicle controller.

19. The method of claim 18, further comprising:

at the vehicle controller, comparing a first address in the first address field of a current transferred data block with a second address in the second address field of a preceding transferred data block; and at the vehicle controller, determining the current transferred data block is correct if the first address included in the current transferred data block is equal to the second address included in the preceding transferred data block in the vehicle controller.

20. The method of claim 19, further comprising transferring the second address included in the preceding transferred data block from the vehicle controller to the rewriting device if it is determined that the current transferred data block is not correct, for requesting the rewriting device to retransfer a correct data block that has said second address in the first address field; and retransferring the correct data block from the rewriting device to the vehicle controller.

21. The method of claim 20, wherein the retransfer of the correct data block is performed if the second address transferred from the vehicle controller is within a predetermined range.

22. The memory rewriting system of claim 21, the predetermined range includes an address value in the first address field of a data block transferred immediately before the retransfer request, an address value in the first address field of the data block preceding such data block, and an address value in the first address field of the data block that was to be transferred following such data block.

23. The method of claim 20, further comprises retransferring data blocks of the first program from the beginning if a difference between the second address transferred from the vehicle controller and an address in the first address field of the data block transferred immediately before the retransfer request is greater than a predetermined value.

* * * * *